US012267972B1

(12) United States Patent
Ribeiro et al.

(10) Patent No.: US 12,267,972 B1
(45) Date of Patent: Apr. 1, 2025

(54) ELECTRONIC APPARATUS HAVING ENCLOSURE WITH ANGLED CABLE ROUTING CHANNEL

(71) Applicant: UBICQUIA, INC., Fort Lauderdale, FL (US)

(72) Inventors: Claudio Santiago Ribeiro, Evanston, IL (US); John Dorfman, Evanston, IL (US); Travis Ronald Coleman, Sunrise, FL (US)

(*) Notice: Subject to any disclaimer, the term of this patent is extended or adjusted under 35 U.S.C. 154(b) by 670 days.

(21) Appl. No.: 17/565,418

(22) Filed: Dec. 29, 2021

Related U.S. Application Data

(63) Continuation of application No. 29/810,641, filed on Oct. 7, 2021, now Pat. No. Des. 997,141.

(51) Int. Cl.
*H05K 5/02* (2006.01)
*H05K 5/06* (2006.01)

(52) U.S. Cl.
CPC ........... *H05K 5/0247* (2013.01); *H05K 5/069* (2013.01)

(58) Field of Classification Search
CPC .............................. H05K 5/0247; H05K 5/069
See application file for complete search history.

(56) References Cited

U.S. PATENT DOCUMENTS

| | | | | |
|---|---|---|---|---|
| 4,731,551 A * | 3/1988 | Gibbs | ..................... | H05B 47/16 315/159 |
| 8,864,514 B2 * | 10/2014 | Ilyes | ..................... | H01R 24/38 439/337 |
| 10,873,170 B2 * | 12/2020 | Zimmerman, III | .......................... | H04B 10/25891 |
| 11,116,062 B1 * | 9/2021 | Leizerovich | .......... | G06F 1/3296 |
| 11,306,907 B2 * | 4/2022 | Gao | ..................... | F21V 23/0442 |
| D997,141 S * | 8/2023 | Ribeiro | ................. | F21V 23/001 D14/230 |
| 11,916,342 B2 * | 2/2024 | Zimmerman, III | .... | H05B 47/18 |
| 12,018,826 B1 * | 6/2024 | Ribeiro | ..................... | F16B 5/02 |
| 12,022,592 B2 * | 6/2024 | Leizerovich | ............ | F21S 8/086 |
| 2013/0064136 A1 * | 3/2013 | Apostolakis | .......... | H04W 88/16 370/254 |
| 2013/0210252 A1 * | 8/2013 | Ilyes | .................... | H01R 33/945 439/226 |
| 2019/0341732 A1 * | 11/2019 | Aaron | .................... | H01R 33/90 |
| 2020/0383173 A1 * | 12/2020 | Aaron | .................... | H05B 45/12 |
| 2021/0075170 A1 * | 3/2021 | Zimmerman, III | ..... | F21V 23/06 |
| 2021/0080091 A1 * | 3/2021 | Gao | ........................ | F21V 23/002 |
| 2022/0167487 A1 * | 5/2022 | Leizerovich | .............. | G06F 1/28 |

\* cited by examiner

*Primary Examiner* — Anthony M Haughton
*Assistant Examiner* — Theron S Milliser
(74) *Attorney, Agent, or Firm* — Daniel C. Crilly (57) ABSTRACT

An electronic apparatus includes a housing enclosure having a peripheral wall configured to enclose electronic circuitry having at least one cable coupled to the electronic circuitry and an angled channel on at least one portion of the peripheral wall. The angled channel is configured to enable routing of the at least one cable from an interior of the housing enclosure to an exterior of the housing enclosure. In some embodiments, the angled channel is filled with a filler, such as epoxy, to maintain the one or more wireless cables in a fixed position and to seal the angled channel from a surrounding environment external to the housing enclosure. In other embodiments, the electronic apparatus further includes a base housing member or bottom enclosure member. In some embodiments, the electronic apparatus is an ambient light sensor apparatus.

20 Claims, 8 Drawing Sheets

ELECTRONIC APPARATUS HAVING ENCLOSURE WITH ANGLED CABLE ROUTING CHANNEL

CROSS-REFERENCE TO RELATED APPLICATIONS

The present application is a continuation of U.S. application Ser. No. 29/810,641, which application was filed Oct. 7, 2021 and is incorporated herein by this reference as if fully set forth herein.

TECHNICAL FIELD

The present disclosure generally relates to enclosures for electronic devices. More particularly, but not exclusively, the present disclosure relates to electronic devices having an enclosure with a channel for wire routing.

BACKGROUND

As is known, many different types of electronic devices such as small cells, environmental sensors, or monitoring devices are mounted in an outside environment subject to heat, moisture and structural or environmental constraints. Such small cells, sensors, and monitoring devices are housed in structures that are poorly suited for providing adequate heat dissipation and moisture intrusion within a housing that holds the components comprising such cells, sensors and monitoring devices. Furthermore, the external wiring and connectors associated with such small cell devices can be disorganized, confusing, or otherwise difficult for installers to install as they may include wiring for numerous purposes including power, signaling, control and communications.

Some of the different types of electronic devices such as sensors, wireless gateways, hubs, and small cells include transceivers and other components. Small cells can include microcells, metrocells, picocells, and femtocells. Microcells generally cover an area having diameter less than about one mile and operate with a radiated power of about five watts (5 W) to ten watts (10 W). Metrocells generally cover an area having a diameter of less than about a half mile and operate with a radiated power of about 5 W or less. Metrocells can provide wireless cellular-based service for up to about 200 concurrent mobile devices. Pico cells generally cover an area having a diameter less than about 500 feet and operate with a radiated power of about 100 milliwatts (mW) to 5 W and providing cellular-based wireless service for up to about five dozen concurrent mobile devices. Femtocells generally cover areas having a diameter less than about 30 feet and operate with a radiated power of about 10 mW to 1000 mW to provide cellular-based service for up to just a few mobile devices. Generally, the higher wattage or power devices will require greater heat dissipation, which may include heat sinks and other devices. Also, the greater number of functions that the electronic device serves, the more likely that the electronic device will include more wiring for routing.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

SUMMARY

In some embodiments, an electronic apparatus includes a housing enclosure having a peripheral wall configured to enclose electronic circuitry having at least one cable coupled to the electronic circuitry and an angled channel (e.g., downwardly angled with reference to a closed top portion of the housing enclosure) on at least one portion of the peripheral wall, the angled channel configured to enable the routing of at least one cable from an interior of the housing enclosure to an exterior of the housing enclosure. In some embodiments, the angled channel enables the routing of at least one cable without crimping the cable. In some embodiments, the angled channel is filled with a filler to maintain at least one cable in a fixed position and to seal the angled channel from a surrounding environment external to the housing enclosure. In yet other embodiments, the angled channel further includes at least one tube coextensive with the path of the angled channel and further configured to route at least one cable through at least one tube.

In some embodiments, the electronic apparatus includes an ambient light sensor and the at least one cable includes one or more among a power cable, a data cable, and an antenna cable. In some embodiments, the at least one cable can be a plurality of cables where the angled channel further comprises a plurality of tubes coextensive with the path of the angled channel and further constructed and configured to route the plurality of cables respectively through the plurality of tubes.

In some embodiments, the electronic apparatus includes an ambient light sensor for mounting on an exterior luminaire and the at least one cable includes at least one or more among a National Electrical Manufacturers Association (NEMA) power cable, a NEMA signal cable, a Wi-Fi antenna cable, an LTE antenna cable, a GPS antenna cable, and an ambient light sensor bundle cable. In some embodiments, the at least one cable includes a Wi-Fi antenna cable, an LTE antenna cable, and a GPS antenna.

In some embodiments, the electronic apparatus further includes a NEMA connector on a bottom portion of the housing enclosure.

In some embodiments, the electronic apparatus includes an ambient light sensor for mounting on an exterior luminaire and the at least one cable includes a National Electrical Manufacturers Association (NEMA) power cable, a NEMA signal cable, a Wi-Fi antenna cable, an LTE antenna cable, and a GPS antenna.

In some embodiments, the housing enclosure is substantially cylindrical in shape with an opening at a bottom portion of the housing enclosure and further includes a base housing member that fits within the opening at the bottom portion and where the base housing member resides either flush with or inset from a bottom plane of the housing cover to enable a flush mount.

In some embodiments, a sensor apparatus for mounting on and controlling the functionality of a luminaire includes a housing enclosure formed from a closed top portion having a peripheral wall and an open-ended bottom portion that mates and closes with an enclosure bottom portion where the housing enclosure is configured to enclose electronic circuitry having one or more cables coupled to the electronic circuitry. The apparatus further includes an angled channel (e.g., downwardly angled with reference to the closed top portion of the housing enclosure) on at least one portion of the peripheral wall, the angled channel configured to enable the routing of one or more cables from an interior of the housing enclosure to an exterior of the housing enclosure, where the angled channel includes an interior access port and an exterior access port.

In some embodiments, the angled channel enables the routing of the one or more cables without crimping the one or more cables. In some embodiments, the angled channel is filled with epoxy to maintain the one or more cables in a fixed position and to seal the angled channel from a surrounding environment external to the housing enclosure. In some embodiments, the angled channel further includes one or more tubes coextensive with the path of the angled channel and further configured to route the one or more cables through the one or more tubes.

In some embodiments, the sensor apparatus includes an ambient light sensor, and the one or more cables comprises at least one or more among a National Electrical Manufacturers Association (NEMA) power cable, a NEMA signal cable, a Wi-Fi antenna cable, a cellular (e.g., LTE) antenna cable, a GPS antenna cable, and an ambient light sensor bundle cable.

In some embodiments, the sensor apparatus includes an ambient light sensor, and the one or more cables includes a Wi-Fi antenna cable, a cellular antenna cable, and a GPS antenna. In some embodiments, the sensor apparatus further includes a NEMA connector on the enclosure bottom portion.

In some embodiments, a sensor apparatus for mounting on and controlling the functionality of a luminaire includes a housing enclosure formed from a closed top portion having a peripheral wall and an open ended bottom portion that mates and closes with an enclosure bottom portion, where the housing enclosure is configured to enclose electronic circuitry having at least one or more wireless communication cables coupled to the electronic circuitry and an angled channel on at least one portion of the peripheral wall, the angled channel configured to enable the routing of the one or more wireless communication cables from an interior of the housing enclosure to an exterior of the housing enclosure, where the angled channel includes an interior access port and an exterior access port. In some embodiments, the sensor apparatus further includes a National Electrical Manufacturers Association (NEMA) power cable, a NEMA signal cable, and an ambient light sensor bundle cable all coupled to the electronic circuitry and where the angled channel routes the wireless communication cables, the NEMA power cable, the NEMA signal cable, and the ambient light sensor bundle cable from an interior of the housing enclosure to an exterior of the housing enclosure.

BRIEF DESCRIPTION OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. Also in these instances, well-known structures may be omitted or shown and described in reduced detail to avoid unnecessarily obscuring descriptions of the embodiments.

Figure 6:
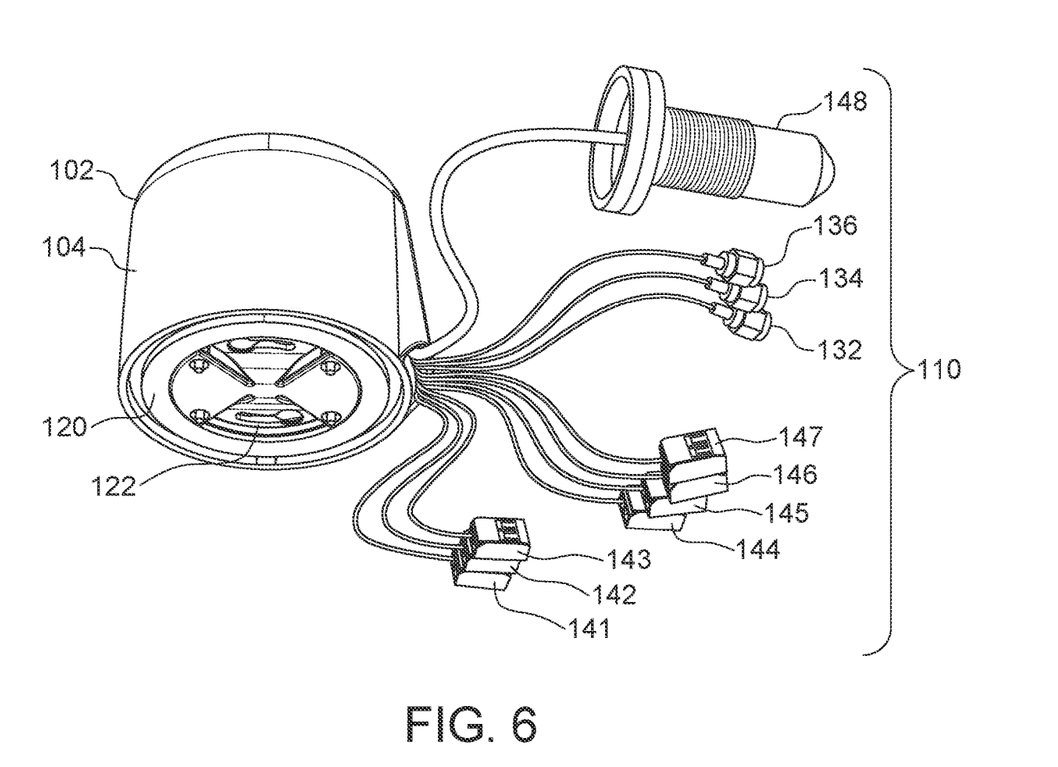
FIG. 6 is a bottom perspective view of an alternative electronic apparatus illustrating external wiring options in accordance with some embodiments.
Figure 7:
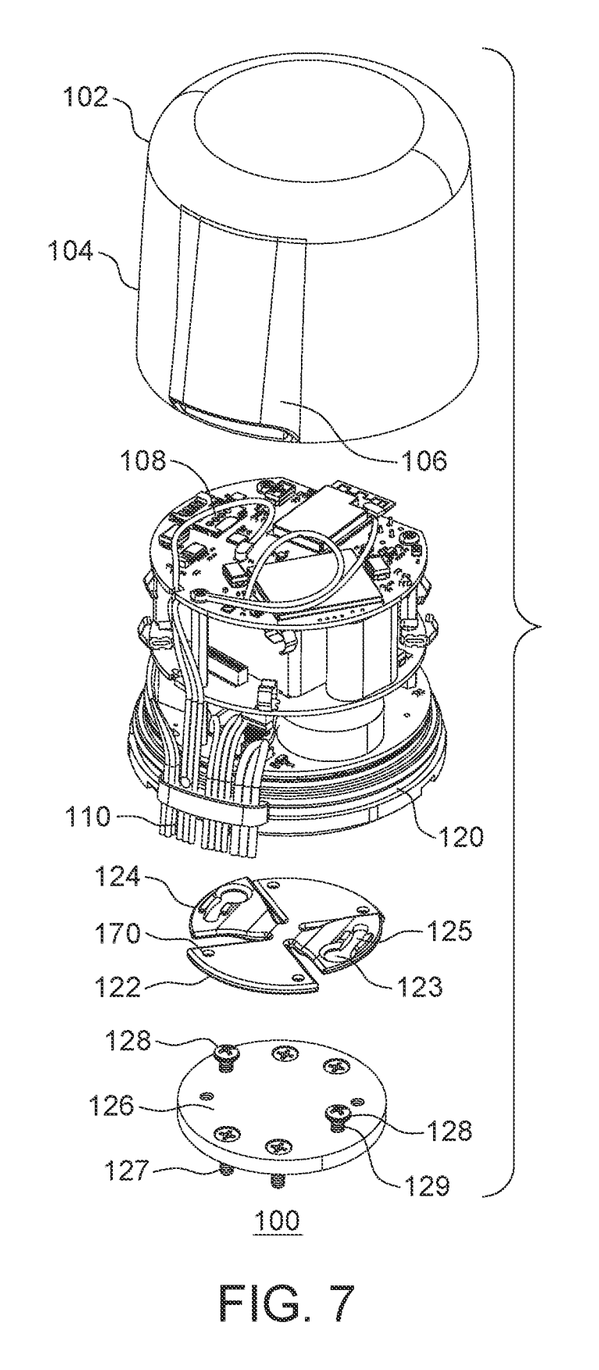
FIG. 7 illustrates an exploded view from a top perspective of the electronic apparatus of FIGS. 1-5, in accordance with some embodiments.
Figure 8:
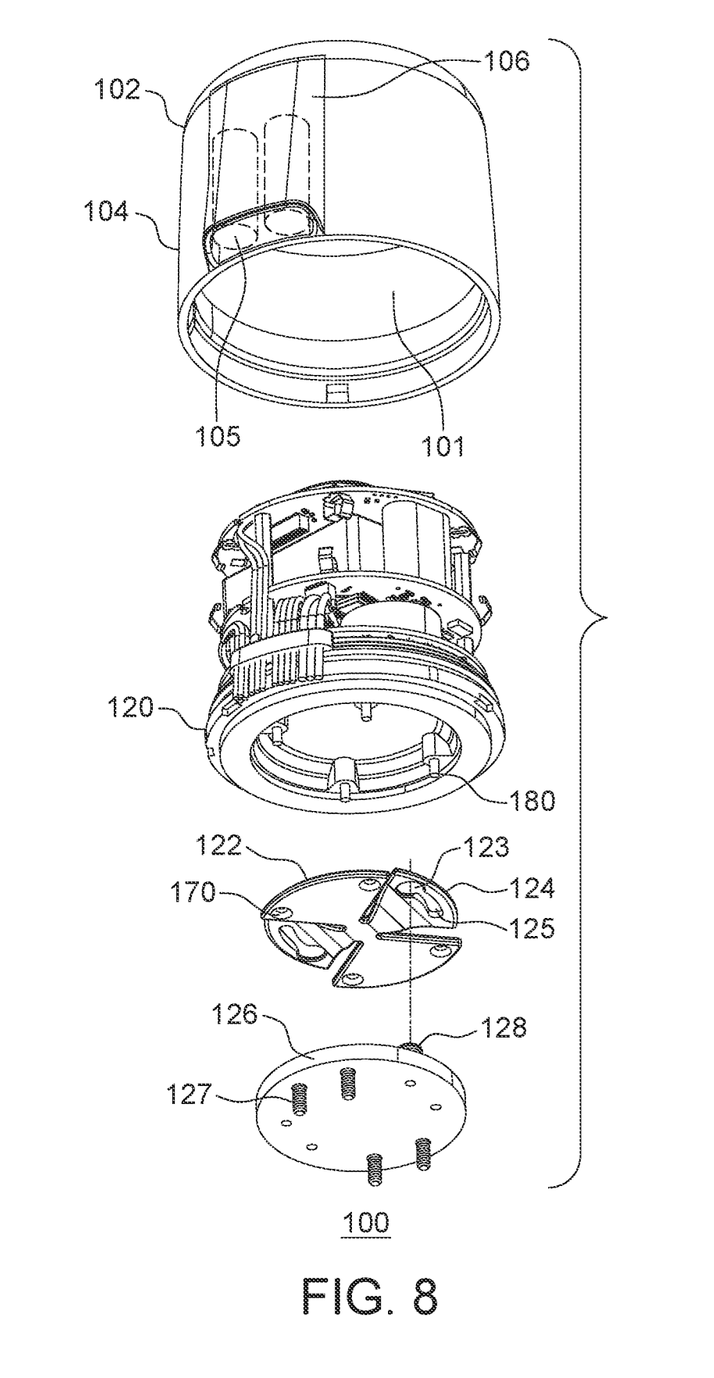
FIG. 8 illustrates an exploded view from a bottom perspective of the electronic apparatus of FIGS. 1-5, in accordance with some embodiments.

Referring to FIGS. 1-8, various views of an exemplary electronic apparatus 100 that includes a housing enclosure 102 having a peripheral wall 104 configured to enclose electronic circuitry 108 (see FIG. 5 or 7) having at least one cable 110 coupled to the electronic circuitry 108 and an angled channel 106 (e.g., angled or angled in another direction depending on an orientation of the housing enclosure 102) on at least one portion of the peripheral wall 104, the angled channel 106 configured to enable the routing of at least one cable 110 from an interior of the housing enclosure to an exterior of the housing enclosure. In some embodiments, the angled channel 106 enables the routing of at least one cable 110 without crimping the cable. This is quite useful when the electronic product 100 is flush mounted to a wall or other surface and very little spacing is available to maneuver the cables 110 during installation or repair. In some embodiments, the angled channel 106 is filled with a filler 111 (see FIG. 5 or 11 for another embodiment) to maintain at least one cable in a fixed position and to seal the angled channel 106 from a surrounding environment external to the housing enclosure. The filler 111 can be any number of suitable materials such as epoxy resin. In yet other embodiments, the angled channel 106 further includes at least one tube 105 (as shown in FIG. 8) coextensive with the path of the angled channel 106 and further configured to route at least one cable 110 through at least one tube 105. In such embodiments, the filler 11 (if used) can occupy the spacing around the tube or tubes 105 and/or within the tubes once the cables 110 are placed through such tubes.

Figure 1:
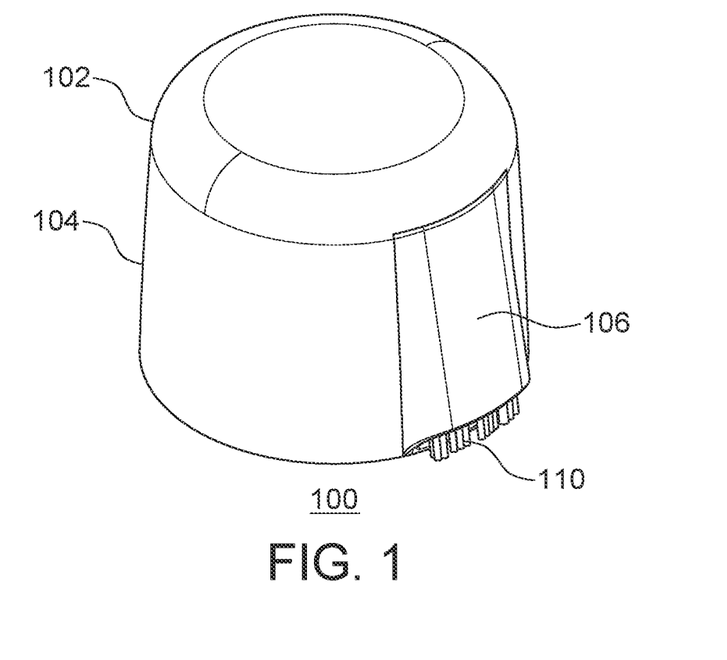
FIG. 1 illustrates a top perspective view of an electronic apparatus in accordance with some embodiments.
Figure 2:
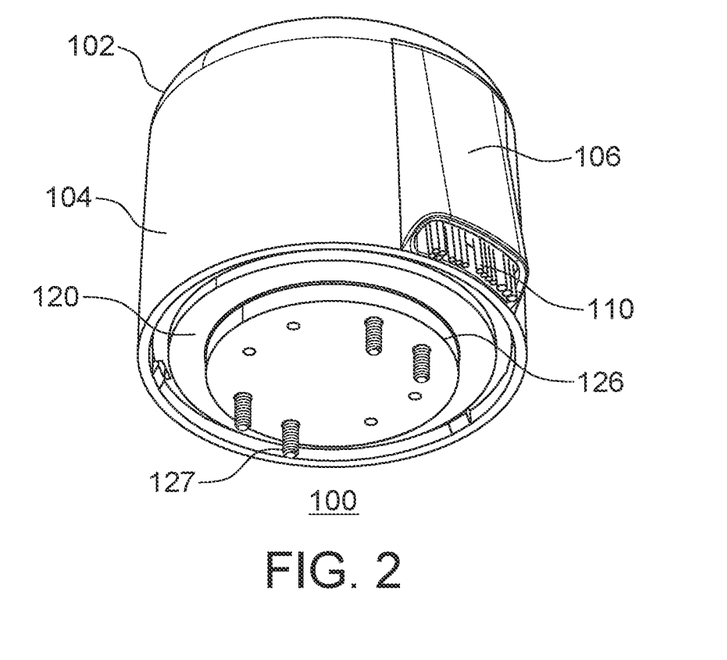
FIG. 2 illustrates a bottom perspective view of the electronic apparatus of FIG. 1 in accordance with some embodiments.
Figure 3:
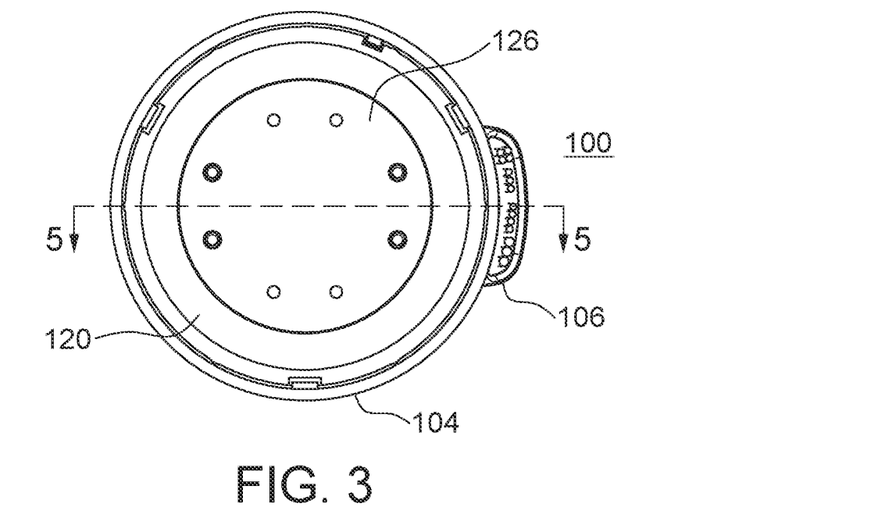
FIG. 3 illustrates a bottom plan view of the electronic apparatus of FIG. 1, in accordance with some embodiments.
Figure 4:
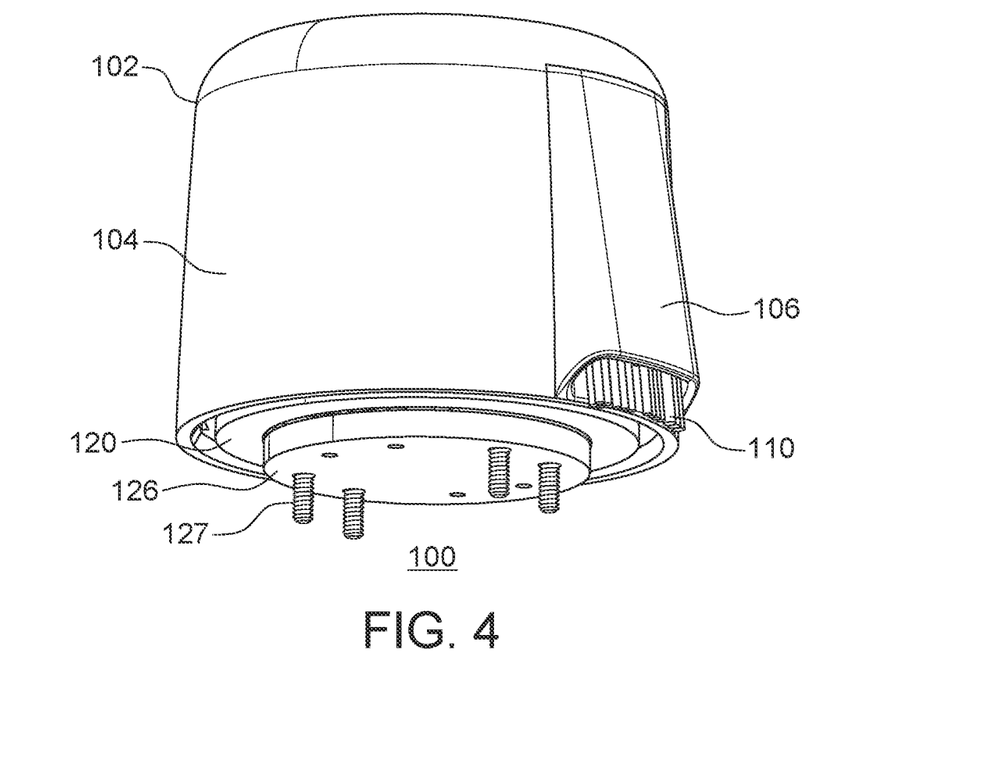
FIG. 4 illustrates a bottom left perspective view of the electronic apparatus of FIG. 1, in accordance with some embodiments.
Figure 5:
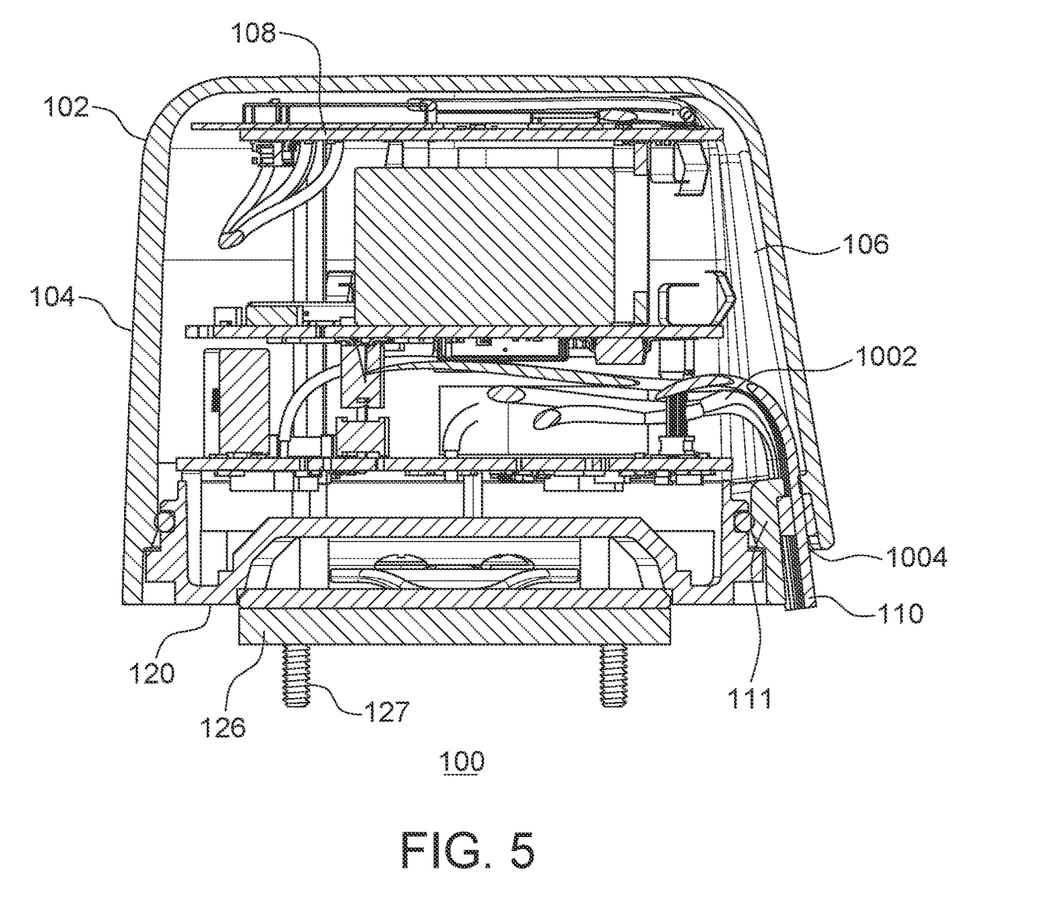
FIG. 5 illustrates a cross-sectional view of the electronic apparatus of FIG. 1 along line 5-5 in FIG. 1, in accordance with some embodiments.

In some embodiments and with additional reference to FIGS. 5-7, the electronic product 100 (or 200 with respect to FIGS. 11 and 12) includes circuitry 108 such as an ambient light sensor or other circuitry and the at least one cable 110 includes one or more among a power cable (141, 142, or 143), a data cable (144, 145, 146, or 147), an antenna cable (132, 134, or 136). In some embodiments, the electronic apparatus 100 can further include an ambient light sensor bundle cable 148 as shown in FIG. 6. In some embodiments, the at least one cable 110 can be a plurality of cables where the angled channel 106 further comprises a plurality of tubes 105 coextensive with the path of the angled channel 106 and further constructed and configured to route the plurality of cables 110 respectively through the plurality of tubes 105.

In some embodiments, the electronic apparatus 100 includes circuitry in the form of an ambient light sensor (108) for mounting on an exterior luminaire and the at least one cable includes a National Electrical Manufacturers Association (NEMA) power cable (141, 142 or 143), a NEMA signal cable 144, 145, 146 or 147), a Wi-Fi antenna cable 132, an LTE antenna cable 134, and a GPS antenna 136.

The electronic apparatus 100 (or 200 in FIGS. 11-12) can include circuitry (108) to perform any number of functions or can simply be used for controlling lights. The electronic apparatus 100 or 200 can be used for any functions among operations and maintenance, advanced light control, utility metering, power loss detection, tilt and/or vibration sensing, location services, and/or communications. The configuration is flexible to allow any number of cable connections to external devices via the downward channel 106 (or via the connector 229 as necessary for a particular configuration—see FIGS. 11-12). In some embodiments, the circuitry 108 can have firmware that is updateable via over-the-air programming. In some embodiments, the electronic apparatus 100 or 200 can be used on a number of streetlights as part of a smart city area that can provide sensor data aggregation.

In some embodiments, the housing enclosure 102 is substantially cylindrical in shape with an opening 101 (see FIG. 8) at a bottom portion of the housing enclosure 102 and further includes a base housing member 120 that fits within the opening at the bottom portion and where the base housing member 120 resides either flush with or inset from a bottom plane of the housing cover to enable a flush mount to an exterior object like a streetlight.

In some embodiments, the electronic apparatus 100 (or 200) is an ambient light sensor apparatus for mounting on and controlling the functionality of a luminaire that includes a substantially cylindrical shaped housing enclosure 102 formed from a closed top portion (102) having a peripheral wall 104 and an open ended bottom portion 101 that mates and closes with an enclosure bottom portion 120 where the substantially cylindrical housing enclosure 102 is configured to enclose electronic circuitry 108 having one or more cables 110 coupled to the electronic circuitry 108. The apparatus further includes a downwardly angled channel 106 on at least one portion of the peripheral wall 104, the downwardly angled channel 106 configured to enable the routing of one or more cables (110) from an interior of the closed top portion to an exterior of the closed top portion, where the downwardly angled channel includes an interior access port 1002 and an exterior access port 1004 as shown in FIG. 5.

In some embodiments, the downwardly angled channel 106 enables the routing of the one or more cables 110 without crimping the one or more cables. In some embodiments, the downwardly angled channel 106 is filled with epoxy (111) as shown in FIG. 5 to maintain the one or more cables 110 in a fixed position and to seal the downwardly angled channel 106 from a surrounding environment external to the substantially cylindrical shaped housing enclosure 102. In some embodiments, the downwardly angled channel 106 further includes one or more tubes 105 coextensive with the path of the downwardly angled channel 106 and further configured to route the one or more cables 110 through the one or more tubes 105.

In some embodiments, the ambient light sensor apparatus 100 (or 200) includes an ambient light sensor and the one or more cables are among a National Electrical Manufacturers Association (NEMA) power cable, a NEMA signal cable, a Wi-Fi antenna cable, an LTE antenna cable, a GPS antenna cable, and an ambient light sensor bundle cable as previously noted. In yet other embodiments, the apparatus 100 or 200 includes one or more cables that are just a Wi-Fi antenna cable, an LTE antenna cable, and a GPS antenna. In yet some other embodiments, the ambient light sensor apparatus 100 or 200 further includes a NEMA connector on the enclosure bottom portion (typically instead of including the NEMA power and signal cabling).

In some embodiments, the ambient light sensor apparatus 100 or 200 is for mounting on and controlling the functionality of a luminaire (such as a streetlight or street lamp) and includes a substantially cylindrical shaped housing enclosure (102) formed from a closed top portion having a peripheral wall 104 and an open ended bottom portion 101 that mates and closes with an enclosure bottom portion 120, where the substantially cylindrical housing enclosure 102 is configured to enclose electronic circuitry 108 having at least one or more wireless communication cables (132, 134 or 136) coupled to the electronic circuitry (108) and an angled channel 106 on at least one portion of the peripheral wall 104, the angled channel 106 configured to enable the routing of the one or more wireless communication cables from an interior of the closed top portion to an exterior of the closed top portion, where the angled channel 106 includes an interior access port 1002 and an exterior access port 1004 as shown in FIG. 5. In some embodiments, the ambient light sensor apparatus further includes a National Electrical Manufacturers Association (NEMA) power cable, a NEMA signal cable, and an ambient light sensor bundle cable all coupled to the electronic circuitry and where the downwardly angled channel routes the wireless communication cables, the NEMA power cable, the NEMA signal cable, and the ambient light sensor bundle cable from an interior of the substantially cylindrical shaped housing enclosure to an exterior of the substantially cylindrical shaped housing enclosure as shown in FIG. 6.

In some embodiments, the environmental sensor apparatus (100 or 200) can further include at least one or more processors (not shown) mounted on a substrate that can further include a communication module or transceiver that enables wireless communication of data and control signals over one or any number of known wireless protocols (LTE, 5G, Wi-Fi, etc.).

The wireless transceiver module may provide wireless communication capability to any one or more devices having corresponding wireless transceivers. In some cases, for example, using functionality provided by the wireless transceiver module, the electronic components embedded in a small cell device embodiment are arranged to operate as a Wi-Fi access point. In this way, the electronic components permit one or more mobile devices to access the Internet. Municipalities or other entities may make Internet services available over a determined geographic area (e.g., a neighborhood, a city, an arena, a construction site, a campus, or the like) to remote mobile devices that are in proximity to any one of a plurality of a number of embodiments incorporating the electronic components making up the electronic apparatus 100. For example, if many streetlight fixtures in a neighborhood or city are equipped with a small cell device, such as small cell device 100, then Wi-Fi service can be provided to a large number of users. Further, based on seamless communication between a plurality of small cell device embodiments, the Wi-Fi service can be configured as a mesh that permits users to perceive constant internet connectivity even when the mobile device is in motion.

In some embodiments, the electronic apparatus can be a small cell device that monitors one or more sensors or conditions associated with a corresponding streetlight fixture for events. Examples of events can include, but are not limited to, light source failure (e.g., a burned-out bulb), light pole tilt, external vibrations, light source temperature, external temperature, power usage, images, motion detection, sound recordings, network traffic, network throughput, cellular signal strength, ambient light level, or other information that can be obtained or recorded by the small cell device that makes up the electronic apparatus 100 or 200.

The small cell device can be part of a system or network of streetlight poles, streetlight fixtures, streetlight sources, or the like in a system level deployment controlled by a municipality or other government agency. In other cases, the system controlled by a private entity (e.g., private property owner, third-party service contractor, or the like). In still other cases, a plurality of entities may share control of the system of streetlight poles streetlight fixtures, streetlight sources, or the like.

In other embodiments, each small cell device may be equipped with communication capabilities, which allows for the monitoring or remote control of a light source of the streetlight fixture or of another utility device. Accordingly, each light source in each streetlight fixture or in a broader context each device in any fixture can be monitored and controlled remotely independently or in combination. In the case of a streetlight fixture, each streetlight fixture can be monitored and/or controlled as an independent light source or in combination with other light sources where the electronic apparatus can serve to provide the wireless (or wired) communication of light control signals and any other information (e.g., packetized data) between small cell devices.

As one non-limiting, non-exhaustive example, each small cell device (100 or 200) may operate a small cell-networking device to provide wireless cellular-based network communication services. A mobile device, e.g., mobile device, provisioned by a mobile network operator or carrier can communicate with a small cell in the same or similar manner that a mobile device communicates with a macrocell tower. In at least some cases, an active communication session formed between a small cell and a mobile device may be handed-off to or from a small cell as the mobile device moves into or out from the active range of the small cell. For example, a user having an active communication session enabled by a small cell may be in motion, and when the mobile device is in motion, the active communication session may in some cases be automatically and seamlessly handed off and continue via another small cell or via a macrocell tower.

The electronic apparatus 100 or 200 embodied as a small cell-networking device can be integrated with a light fixture or a light pole and may be formed of any number of materials. The electronic apparatus 100 or 200 can be arranged as a networking device, but in other embodiments, the small cell device is a smart sensor device, a combination device, some other wireless networking device, or some other control device. In some embodiments, the light fixture can include a light source that can be an incandescent light source, a light emitting diode (LED) light source, a high-pressure sodium lamp, or any other type of light source.

In some embodiments, the electronic apparatus 100 or 200 can be screwed and mounted on a planar surface using a screw 127 through a screw hole and a planar bracket mount 126. Again, the electronic apparatus is not limited to attaching to a streetlight, but can attach to any number of objects including, but not limited to a light pole, an LED board, a bracket, a street sign, a highway sign, a bus stop shelter, an ATM, a phone booth, a building, an HVAC unit, a mailbox, a billboard, a light, a parking sign, a stop light, a speed limit sign, a solar cell, a crosswalk sign, a tunnel, a utility box, a water tower, a crane, a radio antenna tower, a store, an awning, a roof, or a parking pay station.

In some embodiments and referring more particularly to FIGS. 7-10, an electronic device housing 100 includes a housing cover 102 having a bottom opening 101, a housing base 120 forming an internal volume when mated with the bottom opening of the housing cover 102, and a plate member 122 having at least a first wing-shaped member 124 and a second wing-shaped member (124) biased or partially deflected into the internal volume of the electronic device housing 100. In some embodiments, the housing cover 102 is substantially cylindrical in shape with a closed top and an open bottom. Note that the embodiments are not limited to having just two wing-shaped members, but embodiments within the scope of the claims contemplate any number of wing-shaped members for the plate member 122. The wing-shaped members would typically have corresponding holes and slots, but not every wing-shaped member would necessarily need a corresponding hole and slot within the scope of the embodiments.

In some embodiments, the plate member 122 further includes at least a first hole and slot aperture combination (123 and 125) and a corresponding second hole and slot aperture combination formed on corresponding individual wing-shaped members 124 of the at least first wing-shaped member and the second winged-shaped member (or plate member 122), where each combination (123 and 125) is proximate to a respective distal end of the corresponding individual wing-shaped members 124.

In some embodiments, the at least the first hole and slot aperture combination (123 and 125) and the second hole and slot combination (123 and 125) of the plate member 122 are arranged and configured to mount the housing base 120 and to a planar mounting bracket 126 by setting the housing base 120 (and plate member 122) over a pair of screws or studs 130 having a screw head 128 and shaft member 129 extending out from the planar mounting bracket 126 where the screw heads 128 vertically traverse through the hole and allowing the shaft member 129 to radially and horizontally traverse the slot 125 of the corresponding individual wing-shaped members 124 of the plate member 122 as the electronic device housing 120 is mounted above the planar mounting bracket 126 and turned. See FIGS. 7 and 8.

Figure 9:
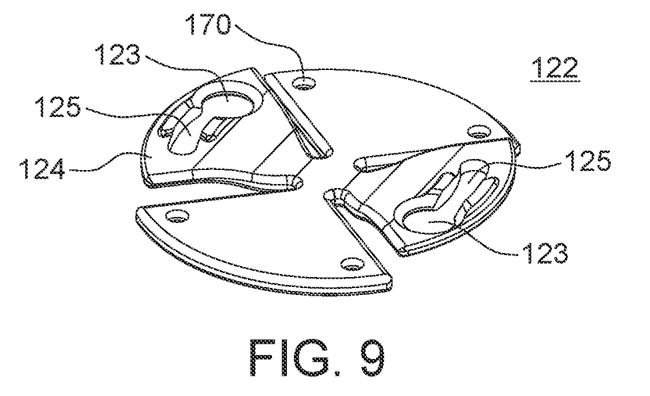
FIG. 9 is a top perspective view of a mounting structure with pairs of interleaved wing-shaped members forming part of the electronic apparatus in accordance with some embodiments.
Figure 10:
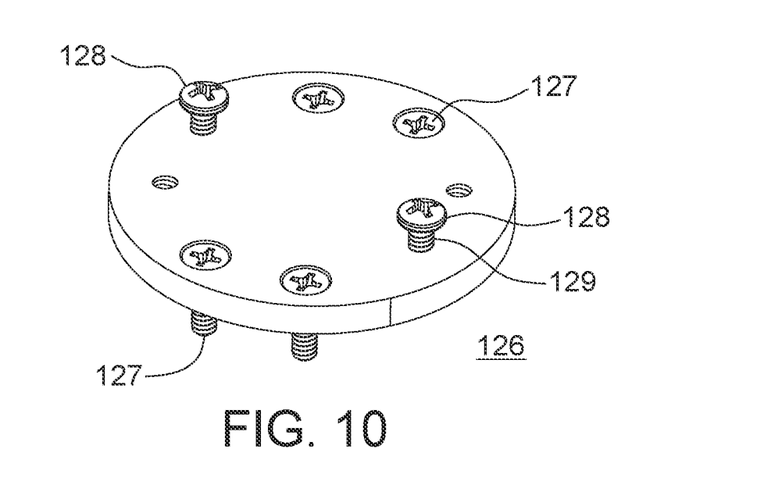
FIG. 10 is a top perspective view of a planar mounting bracket, in accordance with some embodiments.

In some embodiments, the plate member 122 is attached or affixed to the housing base 120 using screws 180 that mate with holes 170 of the plate member 122 (see FIGS. 7, 8, and 9). Of course, other means of attaching the plate member 122 to the housing base 120 are within contemplation of the embodiments. The planar mounting bracket 126 can typically be affixed to a wall or fixture (such as a streetlight or luminaire) using the screws 127 protruding from the bottom of the planar mounting bracket 126. Thus, the mounting of an assembly including the housing cover 102, housing base 120, and plate member 126 simply involves mounting the assembly over the planar mounting bracket 126 and turning the assembly slightly clockwise (or counterclockwise depending on the configuration of the hole and slot aperture combination (123 and 125). The removal or dismounting of the assembly would then simply involve turning the assembly in an opposite direction from the mounting direction.

In some embodiments, the shanks 129 of the screws or studs 130 extending out of the planar mounting bracket 126 traverses an aperture 123 and can subsequently horizontally and radially traverse a slot 125 of at least the first and second hole and slot aperture combinations (123 and 125) as the electronic device housing 120 is turned above the planar mounting bracket 126 and stud 130.

In some embodiments, the tops or screw heads 128 of the screws or studs 130 extending out of the planar mounting bracket 126 deflect the at least first and second wing-shaped members 124 away from the internal volume as the electronic device housing 102 is turned above the planar mounting bracket 126 to enable the at least first and second wing-shaped members 124 to create a compression fit upon or against an exposed surface of the planar mounting bracket 126.

In some embodiments, the electronic device housing 102 forms a portion of an ambient light sensor for mounting to the planar mounting bracket 126 coupled to an exterior luminaire, the ambient light sensor coupled to one or more cables and where the one or more cables comprise at least one or more among a Wi-Fi antenna cable, an LTE antenna cable, a 5G antenna cable, a GPS antenna cable, and/or an ambient light sensor bundle cable.

In some embodiments, an electronic device 100 includes an electronic device housing having a housing cover 102 having a bottom opening 101 and a housing base 120 forming an internal volume when mated with the bottom opening 101 of the housing cover 102. In some embodiments, the housing cover 102 is substantially cylindrical in shape with a closed top and an open bottom (101). The electronic device 100 further includes a plate member 122 having a pair of opposed wing-shaped members 124 biased or partially deflected into the internal volume of the electronic device housing 102. The pair of pair of opposed wing-shaped members 124 can include a first hole (123) and slot (125) aperture combination (123 and 125) and a second hole and slot aperture combination formed in the pair of opposed winged-shaped members, where each combination (123 and 125) is proximate to a respective distal end of the pair of opposed wing-shaped members 124 and where the first hole and slot combination (123 and 125) is oriented in an angular direction opposite to an angular direction of the second hole and slot combination. In some embodiments, the first hole and slot aperture combination (123 and 125) and the second hole and slot combination are arranged and configured to mount the housing base 120 (and plate member 122) over and to a planar mounting bracket 126 by setting the housing base 120 over screw heads 128 of a pair of screws or studs 130 extending out of the planar mounting bracket 126 where tops (128) of the screws or studs 130 traverse through the hole and slot combinations (123 and 125) of the opposed wing-shaped members 124 as the electronic device housing 102 is mounted above the planar mounting bracket 126 and turned. Typically, the screw heads 128 would first vertically traverse upwardly through the hole 123 then allowing the shaft 129 to horizontally and radially traverse through the slot 125.

In some embodiments, the electronic device 100 forms a portion of an ambient light sensor (108) for mounting to the planar mounting bracket 126 coupled to an exterior luminaire, the ambient light sensor coupled to one or more cables 110 and where the one or more cables 110 are at least one or more among a Wi-Fi antenna cable 132, an LTE antenna cable 134, a 5G antenna cable (not shown), a GPS antenna cable 136, and an ambient light sensor bundle cable 148.

In some embodiments, the electronic product has the plate member 122 with the wing-shaped members 124, but no downwardly angled channel as shown. In such instances, the cabling might be replaced with wireless equivalents where wireless data is transmitted and/or received and power can be obtained inductively. In yet other embodiments, the electronic device 100 as shown in FIGS. 1-10 includes a peripheral wall 104 in the housing cover 102 and an open ended bottom portion 101 that mates and closes with the housing base 120, where the housing cover 102 is configured to enclose electronic circuitry 108 having one or more cables 110 coupled to electronic circuitry and where the housing cover 102 further includes a downwardly angled channel 106 on at least one portion of the peripheral wall 104, the downwardly angled channel 106 configured to enable the routing of the one or more cables 110 from an interior of electronic device 100 to an exterior of electronic device 100.

In some embodiments the electronic device 100 can be an ambient light sensor apparatus for mounting on and controlling the functionality of a luminaire having an electronic device housing having a housing cover 102 that is substantially cylindrical shaped having a peripheral wall 104, a bottom opening 101 and a housing base 120 forming an internal volume when mated with the bottom opening 101 of the housing cover 102 where the housing enclosure is configured to enclose electronic circuitry 108 having one or more cables 110 coupled to the electronic circuitry. In some embodiments, the ambient light sensor apparatus can further include a plate member 122 having one or more wing-shaped members and in a particular embodiment can include a pair of opposed wing-shaped members 124 biased or partially deflected into the internal volume of the electronic device housing 102.

In some embodiments, a first hole (123) and slot (125) aperture combination (123 and 125) and a second hole and slot aperture combination (123 and 125) are formed in the pair of opposed winged-shaped members 124, where each combination is proximate to a respective distal end of the pair of opposed wing-shaped members 124 and where the first hole and slot combination (123 and 125) is oriented in an angular direction opposite to an angular direction of the second hole and slot combination on an opposed wing-shape member 124. In some embodiments, the first hole and slot aperture combination and the second hole and slot combination of the plate member 122 are arranged and configured to mount between the housing base 120 and a planar mounting bracket 126 by setting the housing base 120 over respective screw heads 128 of a pair of screws or studs 130 extending out of the planar mounting bracket 126 where tops or screw heads 128 of the screws or studs 128 traverse through the hole 123 and screw shaft 129 traverses through the slot 125 of the hole and slot combinations (123 and 125) of the opposed wing-shaped members 124 as the electronic device housing 102 is mounted above the planar mounting bracket 126 and turned.

Figure 11:
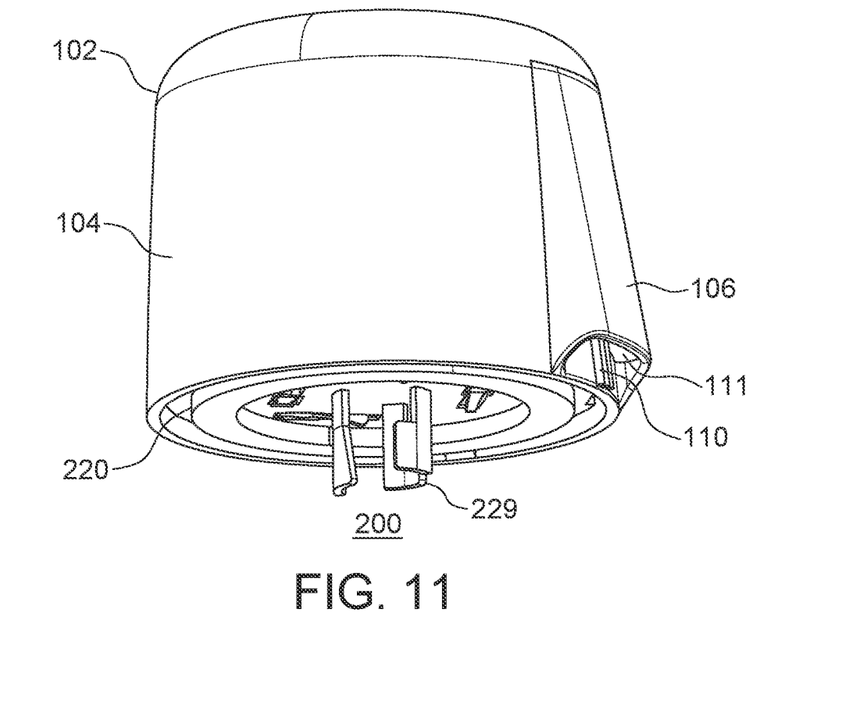
FIG. 11 is a side bottom perspective view of an alternative embodiment of the electronic product using a NEMA connector, in accordance with some embodiments.
Figure 12:
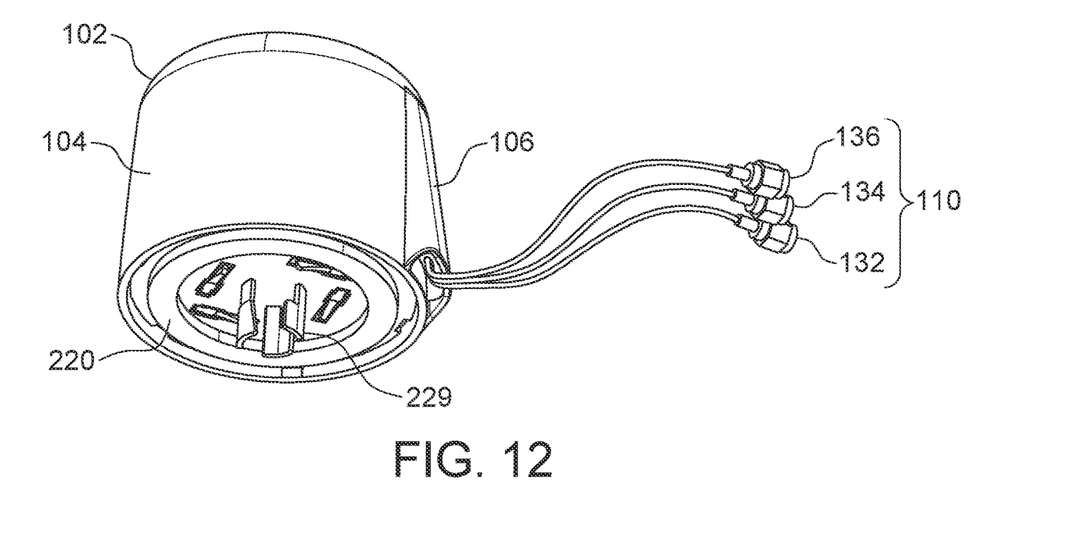
FIG. 12 is a bottom perspective view of the alternative electronic apparatus of FIG. 11 further illustrating external wiring, in accordance with some embodiments.

In some embodiments as illustrated in FIGS. 11 and 12, the electronic device 200 has no external cabling and just uses connectors such as NEMA connectors 229 at a bottom portion of the electronic device 200. In some embodiments, the electronic device (such as an ambient light sensor apparatus) can further include the downwardly angled channel 106 on at least one portion of the peripheral wall 104, the downwardly angled channel 106 configured to enable the routing of the one or more cables 110 from an interior of the electronic device housing to an exterior of the electronic device housing, where the downwardly angled channel 106 includes an interior access port 1002 and an exterior access port 1004 as shown in FIG. 5. As previously noted, the one or more cables can be any combination of a National Electrical Manufacturers Association (NEMA) power cable, a NEMA signal cable, an ambient light sensor bundle cable, a Wi-Fi antenna cable, an LTE antenna cable, a 5G antenna cable, and a GPS antenna cable. If the NEMA connector 229 is used, then the use of a NEMA power cable or NEMA signal cable may be obviated and then the cabling 110 would likely include a Wi-Fi antenna cable 132, an LTE antenna cable 134, a GPS antenna cable 136 as shown in FIG. 12. Other cabling combinations are certainly contemplated within the scope of the embodiments.

Note that references to "substrate" or "board" herein may refer to a circuit board, which may be a printed circuit board ("PCB"), including, without limitation, a single sided PCB, a double-sided PCB, a multilayer PCB, a rigid PCB, a flex PCB, or a rigid-flex PCB or a portion of a housing serving as a substrate. As is understood, any of the above circuit boards may include various electronic components coupled to, or carried by the circuit boards, including, for example, integrated circuits, integrated circuit chips or dies (including, without limitation, semiconductor chips or dies), wires, transistors, leadframes or pads, antennas, receivers, transmitters, transceivers, or other components. Moreover, each of the electronic components described above may be in electronic communication, either via wires (i.e., to transmit power or signals, among other functionality), or wirelessly to one or more of the other electronic components. Further, it is to be understood that any of the above can be coupled to one or more of the other electronic components of the small cell device (100 or 200) through one or more known coupling techniques or materials.

Moreover, in some cases, one or more internal or external antennas may be electrically and communicatively coupled to the small cell device (100, 200) and integrated into, or mounted onto, various features of an external fixture such as a light pole. In some instances, one or more wires may extend through a light pole to communicatively and electrically couple the small cell device and the one or more antennas.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a small cell networking device may be described as being mounted "substantially vertical," In these cases, a device that is mounted exactly vertical is mounted along a "Y" axis and a "X" axis that is normal (i.e., 90 degrees or at right angle) to a plane or line formed by a "Z" axis. Different from the exact precision of the term, "vertical," and the use of "substantially" or "about" to modify the characteristic permits a variance of the particular characteristic by up to 30 percent.

The terms "include" and "comprise" as well as derivatives thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as, "comprises" and "comprising," are to be construed in an open, inclusive sense, e.g., "including, but not limited to."

Reference throughout this specification to "one embodiment" or "an embodiment" or "some embodiments" and variations thereof mean that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity, as the case may be. In addition, the composition of "and" and "or" when recited herein as "and/or" is intended to encompass an embodiment that includes all of the associated items or ideas and one or more other alternative embodiments that include fewer than all of the associated items or idea.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

As the context may require in this disclosure, except as the context may dictate otherwise, the singular shall mean the plural and vice versa. All pronouns shall mean and include the person, entity, firm or corporation to which they relate. Also, the masculine shall mean the feminine and vice versa.

When so arranged as described herein, each computing device may be transformed from a generic and unspecific computing device to a combination device comprising hardware and software configured for a specific and particular purpose. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The various embodiments described above can be combined to provide further embodiments. Aspects of the embodiments can be modified, if necessary to employ concepts of the various patents, application and publications to provide further embodiments.

What is claimed is:

1. An electronic apparatus comprising:
    a housing enclosure having a closed top portion and a peripheral wall;
    an angled channel on at least a portion of the peripheral wall, the angled channel being downwardly angled relative to the closed top portion and configured to enable routing of at least one cable from an interior of the housing enclosure to an exterior of the housing enclosure; and
    electronic circuitry enclosed within the housing enclosure and coupled to the at least one cable.

2. The electronic apparatus of claim 1, wherein the angled channel enables routing of the at least one cable without crimping the at least one cable.

3. The electronic apparatus of claim 1, wherein the angled channel is filled with a filler to maintain the at least one cable in a fixed position and to seal the angled channel from a surrounding environment external to the housing enclosure.

4. The electronic apparatus of claim 1, wherein the angled channel includes at least one tube coextensive with a path of the angled channel and configured for routing the at least one cable to the exterior of the housing enclosure.

5. The electronic apparatus of claim 1, further comprising a light sensor, wherein the at least one cable includes one or more of a power cable, a data cable, and an antenna cable coupled to the light sensor.

6. The electronic apparatus of claim 1, wherein the at least one cable includes a plurality of cables, wherein the angled channel includes a plurality of tubes coextensive with a path of the angled channel, and wherein the plurality of tubes are constructed and configured for routing the plurality of cables to the exterior of the housing enclosure.

7. The electronic apparatus of claim 1, further comprising a light sensor for mounting to a streetlight luminaire, wherein the at least one cable includes at least one of a National Electrical Manufacturers Association (NEMA) power cable, a NEMA signal cable, a Wi-Fi antenna cable, a cellular antenna cable, a GPS antenna cable, and a light sensor bundle cable.

8. The electronic apparatus of claim 7, further comprising a NEMA connector on a bottom portion of the housing enclosure.

9. The electronic apparatus of claim 1, further comprising a light sensor for mounting to a streetlight luminaire, wherein the at least one cable includes at least one of a Wi-Fi antenna cable, a cellular antenna cable, and a GPS antenna cable.

10. The electronic apparatus of claim 1, wherein the housing enclosure is substantially cylindrical in shape with an opening at a bottom portion of the housing enclosure and further includes a base housing member that fits within the opening, and wherein the base housing member resides either flush with or inset from a bottom plane of the housing enclosure to enable a flush mount.

11. A sensor apparatus for controlling functionality of a streetlight luminaire, the sensor apparatus comprising:
    a housing enclosure formed from a closed top portion, a peripheral wall, and a bottom portion;
    an angled channel on at least a portion of the peripheral wall, the angled channel being downwardly angled relative to the closed top portion and configured to enable routing of one or more cables from an interior of the housing enclosure to an exterior of the housing enclosure, wherein the angled channel includes an interior access port and an exterior access port; and
    electronic circuitry enclosed within the housing enclosure and coupled to the one or more cables, the electronic circuitry including a light sensor.

12. The sensor apparatus of claim 11, wherein the angled channel enables routing of the one or more cables without crimping the one or more cables.

13. The sensor apparatus of claim 11, wherein the angled channel is filled with epoxy to maintain the one or more cables in a fixed position and to seal the angled channel from a surrounding environment external to the housing enclosure.

14. The sensor apparatus of claim 11, wherein the angled channel includes one or more tubes coextensive with a path of the angled channel and configured for routing the one or more cables to the exterior of the housing enclosure.

15. The sensor apparatus of claim 11, wherein the one or more cables includes at least one of a National Electrical Manufacturers Association (NEMA) power cable, a NEMA signal cable, a Wi-Fi antenna cable, a cellular antenna cable, a GPS antenna cable, and a light sensor bundle cable.

16. The sensor apparatus of claim 15, further comprising a NEMA connector on the bottom portion of the housing enclosure.

17. The sensor apparatus of claim 11, wherein the one or more cables includes at least one of a Wi-Fi antenna cable, a cellular antenna cable, and a GPS antenna cable.

18. A sensor apparatus mountable to a streetlight luminaire for controlling the functionality of the streetlight luminaire, the sensor apparatus comprising:
    a housing enclosure formed from a closed top portion, a peripheral wall, and a bottom portion;
    an angled channel on at least a portion of the peripheral wall, the angled channel being downwardly angled relative to the closed top portion and configured to enable routing of one or more wireless communication cables from an interior of the housing enclosure to an exterior of the housing enclosure, wherein the angled channel includes an interior access port and an exterior access port; and
    electronic circuitry enclosed within the housing enclosure and coupled to the one or more cables, the electronic circuitry including a light sensor.

19. The sensor apparatus of claim 18, wherein the angled channel is filled with epoxy to maintain the one or more wireless communication cables in a fixed position and to seal the angled channel from a surrounding environment external to the housing enclosure.

20. The sensor apparatus of claim 18, wherein the angled channel includes one or more tubes coextensive with a path of the angled channel and configured for routing the one or more wireless communication cables to the exterior of the housing enclosure.

* * * * *